(12) United States Patent
Purwin

(10) Patent No.: US 7,273,391 B2
(45) Date of Patent: Sep. 25, 2007

(54) APPARATUS FOR IMPROVED CONNECTOR LAYOUT

(75) Inventor: Charles Purwin, Litchfield, NH (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/154,666

(22) Filed: Jun. 17, 2005

(65) Prior Publication Data

US 2006/0105597 A1    May 18, 2006

Related U.S. Application Data

(60) Provisional application No. 60/628,203, filed on Nov. 17, 2004.

(51) Int. Cl.
*H01R 11/00*   (2006.01)
(52) U.S. Cl. .............. 439/502; 439/79; 439/541.5
(58) Field of Classification Search ............ 439/79, 439/502, 541.5
See application file for complete search history.

(56) References Cited

U.S. PATENT DOCUMENTS 5,815,377 A * 9/1998 Lund et al. ............... 361/802
6,672,896 B1 * 1/2004 Li .......................... 439/502
6,709,295 B2 * 3/2004 Givens et al. ......... 439/620.06
2004/0233563 A1 * 11/2004 Wada et al. ................. 360/39

OTHER PUBLICATIONS

*The Printed Circuit Board Primer*, at http://www6.tomshardware.com/howto/20010910/index.html, Tom's Hardware Guide PCs & HowTo, 2 pages; Printed Oct. 21, 2005.

* cited by examiner

*Primary Examiner*—Truc Nguyen
(74) *Attorney, Agent, or Firm*—Sterne, Kessler, Goldstein & Fox PLLC

(57) ABSTRACT

A board has connectors for interfacing to external devices mounted at a rearward edge of the board, minimizing the need to make connections and route connecting cables in the space between the board and adjacent boards installed in a computer system. In one embodiment the board is a RAID controller board and comprises a first edge portion configured to mate with a housing of a computing device, a second edge portion adjacent to the first edge portion and having an edge connector to interface the board with a corresponding slot in a computing device, at least one connector mounted proximate to a third edge portion located opposite the first edge and adapted to provide a data transfer connection with at least one compatible storage device, and a control circuit connected to the edge connector and at least one connector on the board to control the operation of the storage device.

27 Claims, 9 Drawing Sheets

APPARATUS FOR IMPROVED CONNECTOR LAYOUT

CROSS-REFERENCE TO RELATED APPLICATION

This application claims the benefit of U.S. Provisional Application No. 60/628,203 filed Nov. 17, 2004 which is incorporated herein by reference.

FIELD OF THE INVENTION

This invention relates generally to the placement of connectors on printed circuit boards, and in more specific embodiments to an improved connector layout for a redundant array of independent disks (RAID) controller board.

BACKGROUND OF THE INVENTION

A printed circuit board (PCB) is found in almost every electronic device. Besides keeping the components in place a PCB also provides electrical connections between the components mounted on it. As electronic devices have become more complex, and require more components, PCBs have become more densely populated with wiring and components.

A printed circuit board is typically formed as a flat plate or base of insulating material containing a pattern of conducting material. It becomes an electrical circuit when components are attached and soldered to it. The conducting material is commonly copper which has been coated with solder or plated with tin or tin-lead alloy. The usual insulating material is epoxy laminate; however there are many other kinds of materials that can be used as insulators. Single-sided boards are most common in mass-produced consumer electronic products. These single sided boards have all conductors on one side of the board. With two-sided boards, the conductors, or copper traces, can travel from one side of the board to the other through plated-thru holes called vias, or feed-throughs. In multilayer boards, the vias can connect to internal layers as well as the two outer layers.

The substrate of the board itself is an insulating and (usually, but not always) non-flexible material. Thin wires visible on the surface of the board are part of a copper foil that initially covers the entire board during the manufacturing process. In the manufacturing process this copper foil is partly etched away, and the remaining copper forms a network of thin wires. These wires are referred to as the "conductor pattern" and provide the electrical connections between the components mounted on the PCB.

Components that are mounted on one side on the board while its legs are soldered on the opposite side are called "Through Hole" components (THT: Through Hole Technology). Such components take up a large amount of space and require one hole to be drilled in the PCB for every leg. Hence, their legs occupy space on both sides of the board, and the connection points for them are also fairly large. On the other hand, THT components provide a better mechanical connection to the PCB compared to surface mounted devices, which will be discussed below. Connectors for cables and similar devices also have to withstand mechanical stress and are usually mounted using THT.

The legs of components that are made using "Surface Mounted Technology" (SMT) are soldered to the conductor pattern on the same side of the PCB as the component is mounted. This technology therefore does not require a hole in the PCB for every leg of the component. Surface Mounted Components (SMC) can be mounted on both sides of the PCB directly opposite each other.

To connect a PCB to another PCB an "edge connector" is often used. An edge connector may comprise small, uncovered pads of copper located along one side of the PCB. These copper pads are actually part of the conductor pattern on the PCB. The edge connector on one PCB is inserted into a matching connector (known as a "slot") on the other PCB. In a PC, graphic boards, sound boards and other similar products are connected to the motherboard bus using edge connectors. The motherboard may be provided with different types of slots for devices conforming to different industry standards.

Besides cost, other important factors involved in PCB design are system compatibility and ease of use for the end user. System compatibility requires the board to interface both physically and electrically with the system where it is installed. For example, PCB boards conforming to the peripheral component interface (PCI) standard require the PCB board to have an edge connector that can interface with a corresponding slot both physically and electrically. The PCB may also have a bracket or equivalent means to facilitate installation in the computer housing. A PCB board manufacturer follows certain design criteria for a PCI interface to ensure compatibility with PCI-based systems. Layout of components and connectors should facilitate easy integration with the system and other compatible devices. With routing issues and limited space on a PCB, laying out components and connectors to enable a user friendly board design is often challenging.

These challenges are particularly significant in the context of laying out connectors for a redundant array of independent disks (RAID) controller board. RAID arrays comprise several disks that are grouped together in various organizations to improve performance and/or reliability of a computer's storage system. These disks are grouped and organized by a RAID controller. One typical form factor for a RAID controller is a PCB board, such as a PCI board, on which a control circuit is mounted. The control circuit exchanges signals with storage devices through connectors provided on the RAID controller board and thereby controls the operation of the storage devices. A typical RAID controller can manage around eight to twelve disk drives and hence requires eight to twelve connectors on the board. Since the connectors on a RAID controller board mate with corresponding disk drive connectors and cables, there may be eight to twelve drive connections per board. Some conventional designs place connectors in a random arrangement on the surface of the RAID controller board. The placement and orientation of such connectors often makes it cumbersome to mate disk drive connectors to the RAID board. Conventional connector layout often requires bending and routing of connector cables and prevents an orderly arrangement of connector cables.

The inventor has determined that there is a need for an improved approach to PCB board design that facilitates connection of cables between PCBs and devices connected to the PCBs. In particular, the inventor has found that there is a need for improved connector and cable routing arrangements in the field of RAID controller boards.

BRIEF SUMMARY OF THE INVENTION

A PCB is provided with connectors for interfacing to external devices near a rearward edge of the board, minimizing the need to make connections and route connecting cables between the PCB and an adjacent PCB and other obstructions in a computer system housing. In one preferred embodiment the board is a RAID controller board and comprises a first edge portion configured to mate with a housing of a computing device, a second edge portion adjacent to the first edge portion and having an edge connector to interface the board with a corresponding slot in a computing device, at least one connector mounted proximate to a third edge portion located opposite the first edge and adapted to provide a data transfer connection with at least one compatible storage device, and a control circuit connected to the edge connector and at least one connector on the board to control the operation of the storage device.

Additional features and advantages of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed. The detailed description is not intended to limit the scope of the claimed invention in any way.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

Figure 1:
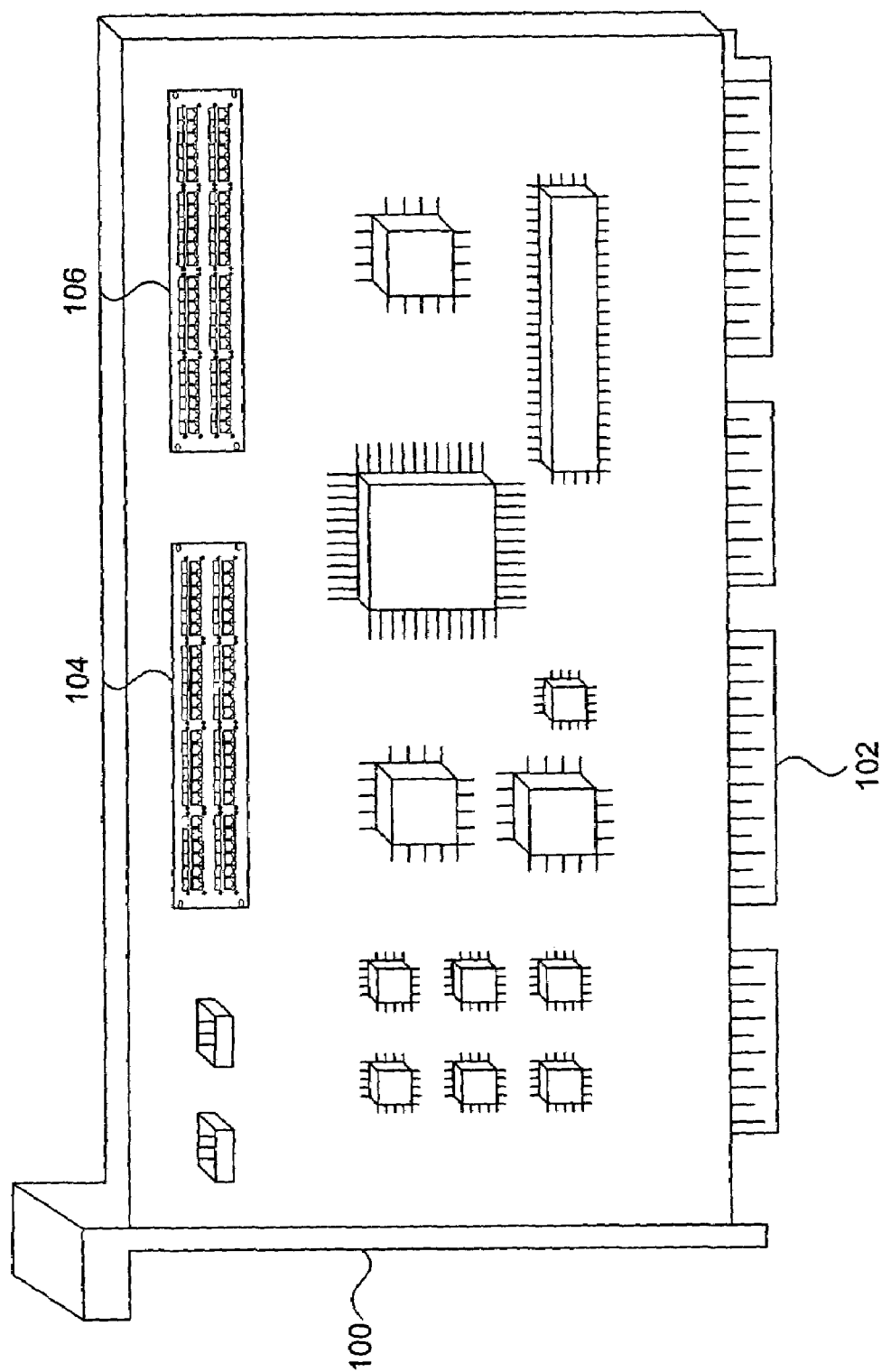
FIG. 1 is a diagram showing connector locations on one example of a conventional RAID controller board.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

The present invention will be described in terms of several embodiments applicable to connector layout on a RAID controller board. It will be understood that the essential layout concepts disclosed herein are applicable to a wide range of board designs and can be applied to boards having varied purposes. Thus, although the invention will be disclosed and described using RAID controller applications as examples, the scope of the invention is not in any way limited to this field.

FIG. 1 is a diagram showing a conventional double sided RAID controller board. Bracket 100 is used to fasten the board to the housing of a computer system and PCI edge connector 102 is used to interface the board with a corresponding slot in the computer system. The board has two connectors 104 and 106 mounted on its surface with the opening perpendicular to the surface of the board. These connectors serve to mate with corresponding connectors or other component devices, such as, for example, disk drive connectors in the RAID array. The inventor has determined that in the arrangement of FIG. 1, the placement and orientation of connectors 104 and 106 make it cumbersome to mate these connectors with corresponding disk drive cables. The connector layout in FIG. 1 also results in a need for various steps of bending and routing of connector cables and prevents an orderly arrangement of wires. Conventional RAID controller board designs sometimes reduce board height in at least one area to make room for connectors and cable routing The inventor has evaluated the architecture of RAID controllers and other boards typically installed in PCs, and has determined that in typical RAID array configurations, the disk drives are located such that cables can be more conveniently routed to the drives from the rear of a RAID controller installed in a slot on the motherboard. Further, connectors mounted in this fashion can be more easily mated with corresponding cables by pushing the cable connectors against the rear-mounted board connectors in a direction parallel to the length of the board.

As will be seen, one feature of several of the embodiments places and orients connectors on the PCB to facilitate mating between RAID controller connectors and corresponding disk drive connectors. Some of these embodiments also facilitate improved routing of connector cables thereby enabling ordered bundling and neater arrangement of connector cables. Another feature of some embodiments improves utilization of board real estate by allowing a greater number of connectors to be mounted on the board and thereby increasing the number of drives that can be connected to the RAID controller without losing the benefits of the more convenient connector placement provided in these embodiments. One typical form factor for some embodiments is a control circuit mounted on a PCB RAID controller to exchange signals with storage devices through connectors provided on the RAID controller board to thereby control the operation of the storage devices. The PCB board may conform to the PCI or PCI 2U standards.

Figure 2:
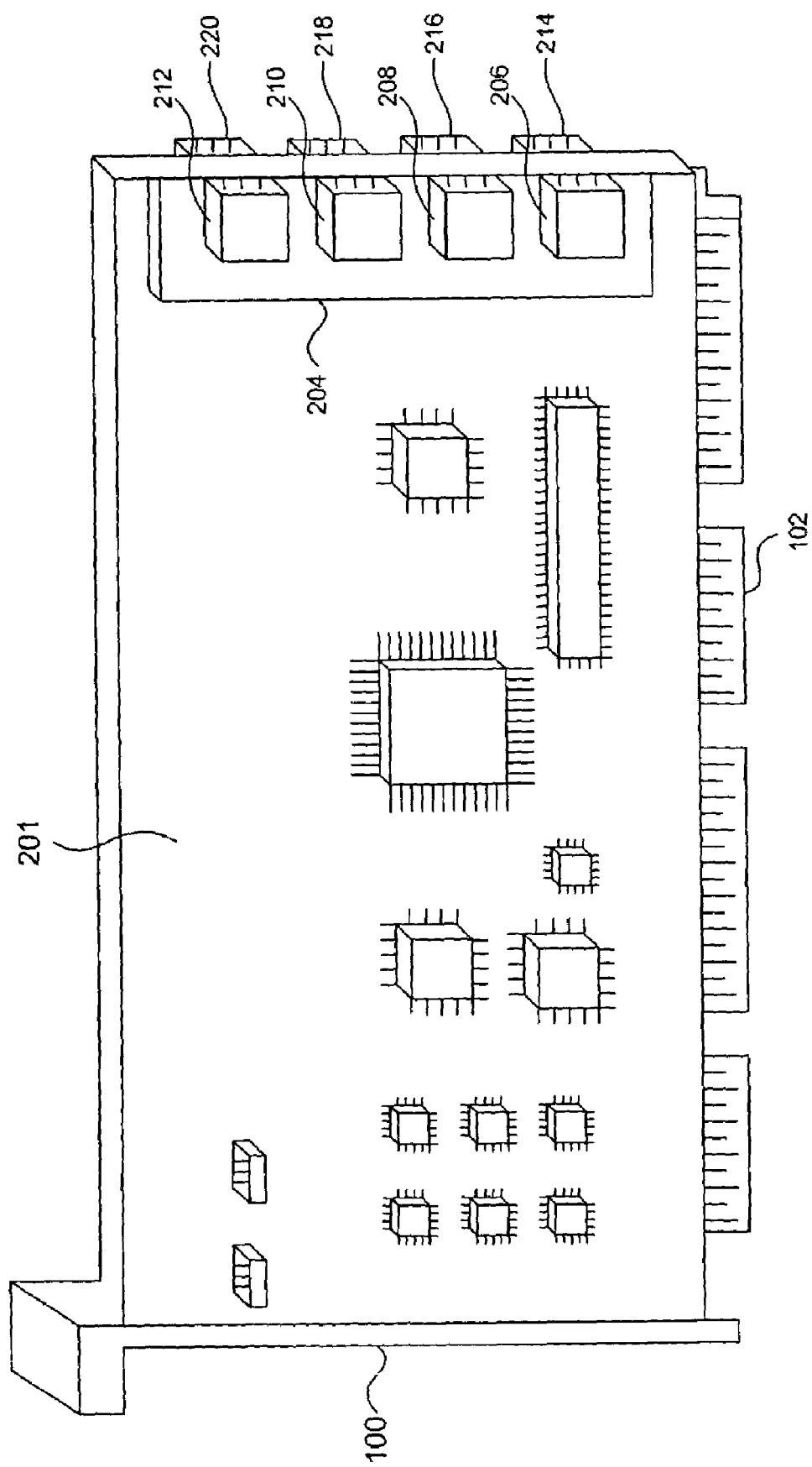
FIG. 2 is a diagram of one embodiment of the invention incorporating a spacer near the rear edge of the board with connectors mounted on the spacer.

FIG. 2 illustrates a RAID controller board 201 having drive connectors mounted on each side of board 201. As shown in FIG. 2, controller board 201 comprises a bracket 100, PCI edge connector 102, spacer 204 and device connectors 206, 208, 210, 212, 214, 216, 218, and 220. Spacer 204 is a piece of insulating material, which may be integral with board 201 or a separate element attached to board 201, used to increase the thickness of board 201, thus providing more separation between the connectors mounted on board 201 than would be provided if the connectors had only the thickness of board 201 between them. Bracket 100 is used to fasten board 201 to the housing of a computer system. PCI edge connector 202 is used to interface board 201 with a corresponding slot in a computing device. Conventional board designs do not allow for placement of some connectors adjacent and immediately opposite each other because the resulting space between them will be insufficient to allow mating with corresponding disk drive connectors. Therefore, spacer 204 is provided to increase the effective thickness of the board, thereby providing support for connectors to be placed in opposed relationship. Spacer 204 is preferably mounted on the rear edge of board 201, opposite to the end on which bracket 100 is mounted, where there is more available space for making connections. This rearward region of board 201 is also closer to component devices such as array disks and facilitates easier connections and bundling of connector cables. As shown in FIG. 2, in this exemplary embodiment device connectors 206, 208, 210 and 212 are mounted atop spacer 204, and device connectors 214, 216, 218 and 220 are mounted opposite connectors 206, 208, 210 and 212, on the opposite side of board 201. The connectors are oriented such that mating with a corresponding disk drive connector occurs through relative movement of the mated disk drive connectors parallel to the length of board 201. That is, the drive cables can be pushed onto connectors 206, 208, 210, 212, 214, 216, 218 and 220 from the end of board 201 without moving the cables or the technician's fingers between board 201 and adjacent boards. The placement and orientation of connectors on the RAID controller board facilitates mating between corresponding connectors. This embodiment also places the connectors closer to the drives in the array thereby simplifying the routing of cables connecting the disk drive to the RAID controller. The cables can then be bundled together to provide a neat, well ordered arrangement.

Figure 3:
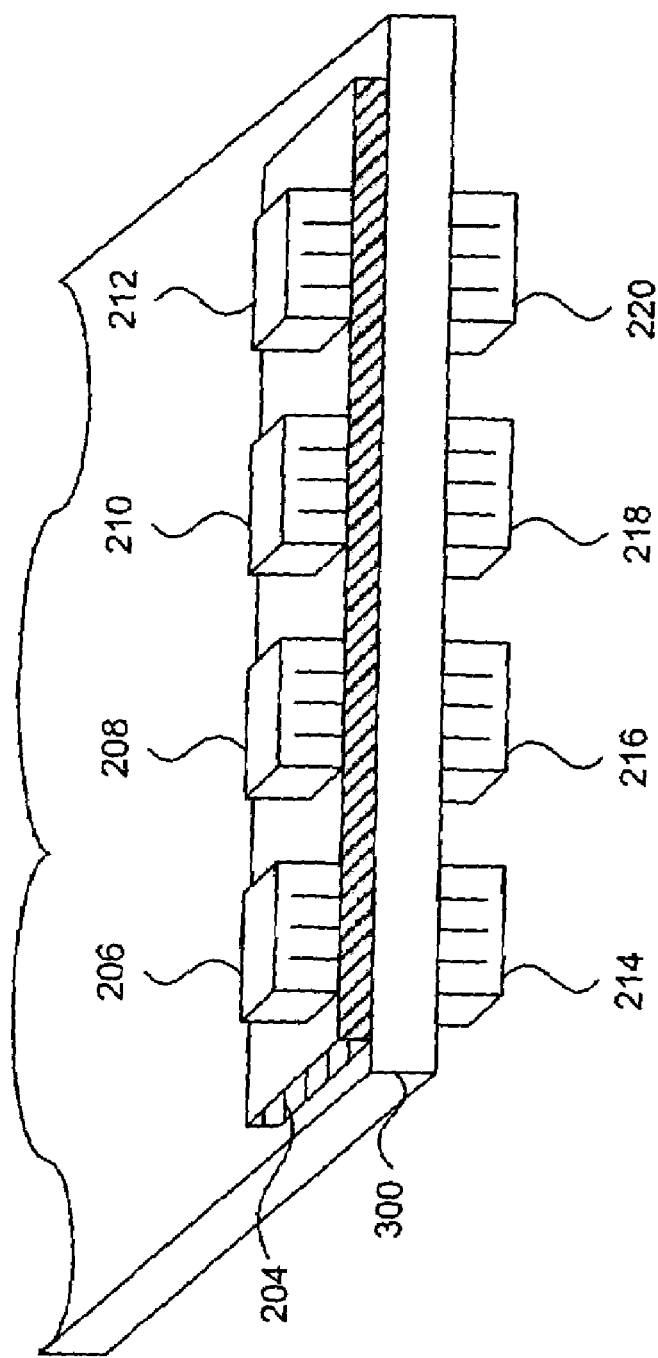
FIG. 3 is a perspective view of the connector attachment region of the board shown in FIG. 2.

FIG. 3 illustrates an edgewise view of the board 300 shown in FIG. 2. The spacer 204 can be placed on either side of the board 300. Device connectors 206, 208, 210 and 212 are mounted on the spacer 204 and device connectors 214, 216, 218 and 220 are mounted below board 300. As can be seen from the figure, multiple connectors can now be accommodated on either side of the board thereby improving utilization of the limited board real estate. The relative thickness of the board increases because of the spacer and the connectors mounted on either side of the board. Although the embodiment presented in FIG. 3 has only one spacer 204, spacers may be placed on both sides of the board or in any other combination thereof to achieve the same results. In an exemplary embodiment the connectors are mounted near the rear edge of the board. However, the exact location and configuration of connectors can vary based on changes in the shape and orientation of the board. Any suitable material may be selected for the spacer. SMT, THT or other known mounting methods can be used to mount the connectors.

Figure 4:
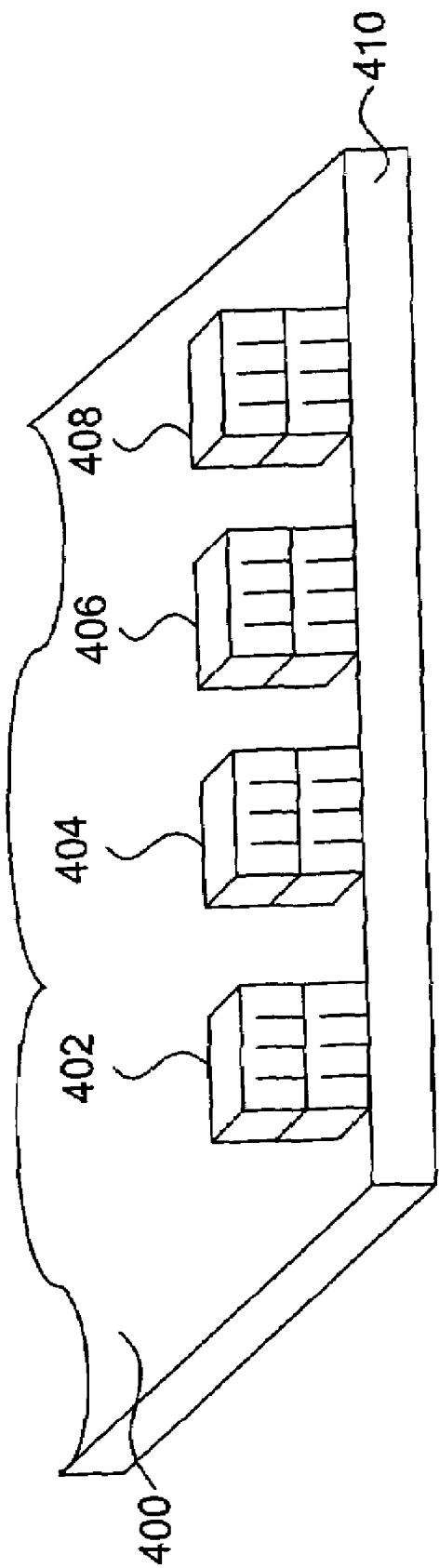
FIG. 4 is a perspective view of a further embodiment of the invention with connectors mounted in a stacked configuration near a rear edge of the board.

FIG. 4 illustrates an edgewise view of another embodiment of the invention. In this embodiment, RAID controller board 400 has one or more dual drive device connectors 402, 404, 406 and 408 mounted proximate to a rear edge 410 of board 400, Dual drive device connectors 402, 404, 406 and 408 comprise two SATA/SAS compliant drive connectors arranged in a stacked configuration with spacing between them to allow connection of two cables to each of the dual drive device connectors 402, 404, 406 and 408. Rear edge 410 of board 400, when board 400 is installed in a computer system, will typically be located close to RAID array disks, and the location of the dual drive connectors generally near the rear edge 410 of board 400 facilitates easier connections, easier cable routing, and bundling of corresponding component connector cables. The use of a dual connector in this embodiment increases the number of connectors that can be mounted on the board, thereby increasing the number of drives that can be conveniently connected to RAID controller board 400.

Figure 5:
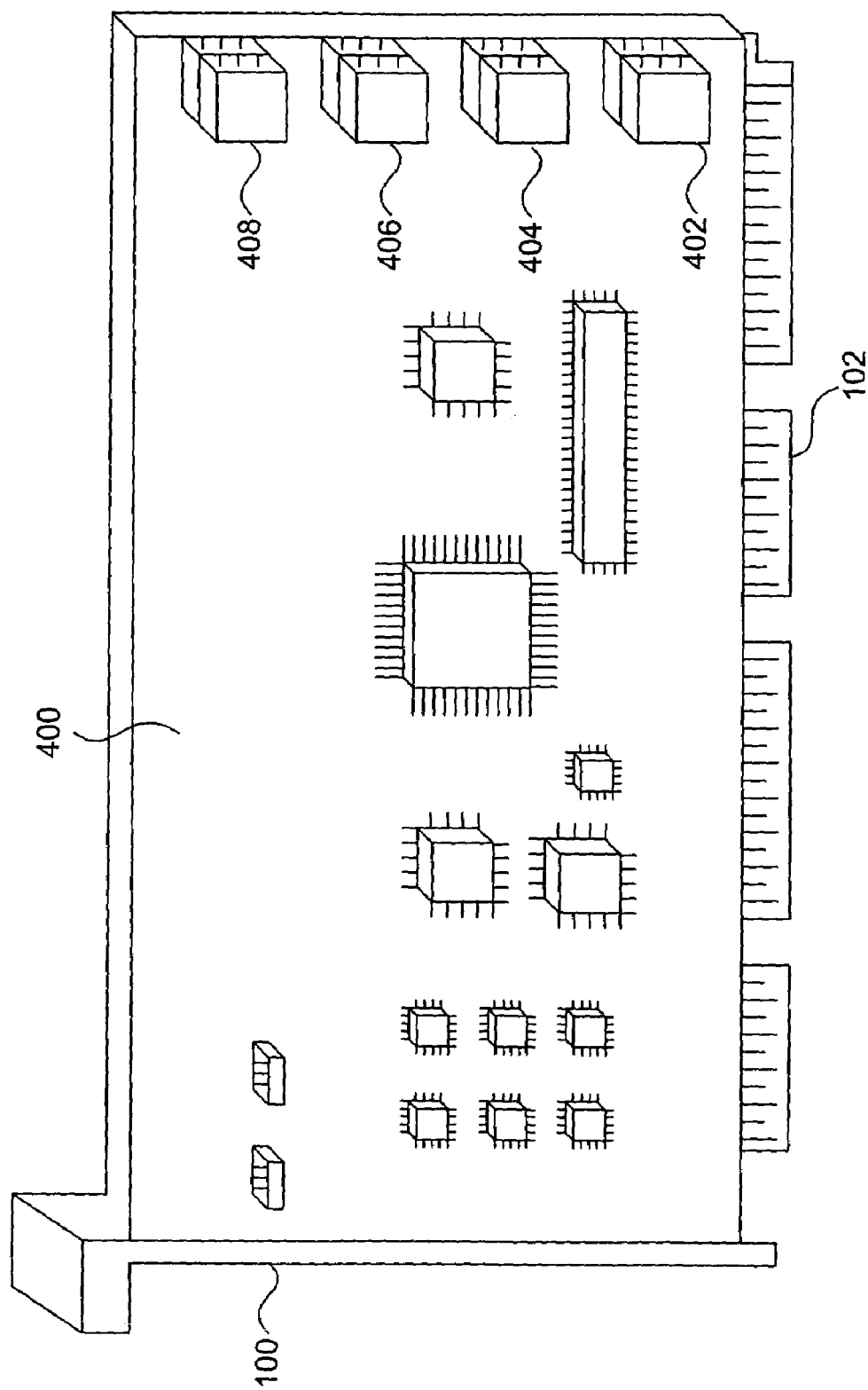
FIG. 5 is a larger perspective view showing the entire board for the embodiment of FIG. 4.

FIG. 5 illustrates another view of the board 400 having disk drive connectors in a stacked configuration. As shown in FIG. 5, the RAID controller board 400 comprises bracket 100, PCI edge connector 102 and device connectors 402, 404, 406 and 408. Bracket 100 is used to fasten the board 400 to the housing of a computer system. In this exemplary embodiment, board 400 is shown in a PCI configuration, and PCI edge connector 102 interfaces the board 400 with a corresponding standard bus slot in the computer system. It will be understood that an interface conforming to any established standard can be used, as well as various proprietary interfaces. Device connector 402 is preferably mounted on a rear edge of board 400, opposite to the end on which bracket 100 is mounted. In one exemplary embodiment, the connectors are oriented such that mating with a corresponding disk drive cable connector occurs through relative movement of the mated connectors in a direction parallel to a length of board 400. The placement and orientation of connectors on RAID controller board 400 thus facilitates mating between corresponding connectors without a need to remove the board from its installed position in the system to connect and disconnect drives. Further, even if there are other boards located near the board on either side, the drive cables and their connectors can be routed to any of connectors 402, 404, 406 and 408 on RAID controller board 400 without any need for the technician to stick his or her fingers between the adjacent boards to manipulate and place connectors and cables. The current embodiment also places the connectors closer to the drives in the array thereby simplifying the routing of cables connecting the disk drive to the RAID controller. The cables can then be bundled together to provide a neat, well-ordered arrangement. The disclosed embodiment mounts connectors near the rear edge of the board. However, the exact location and configuration of connectors can vary based on changes in the shape and orientation of the board. The second connector 404 can be mounted atop the first connector 402 by any suitable means. The first connector 402 can be mounted on the board via SMT, THT or similar technology.

Figure 6:
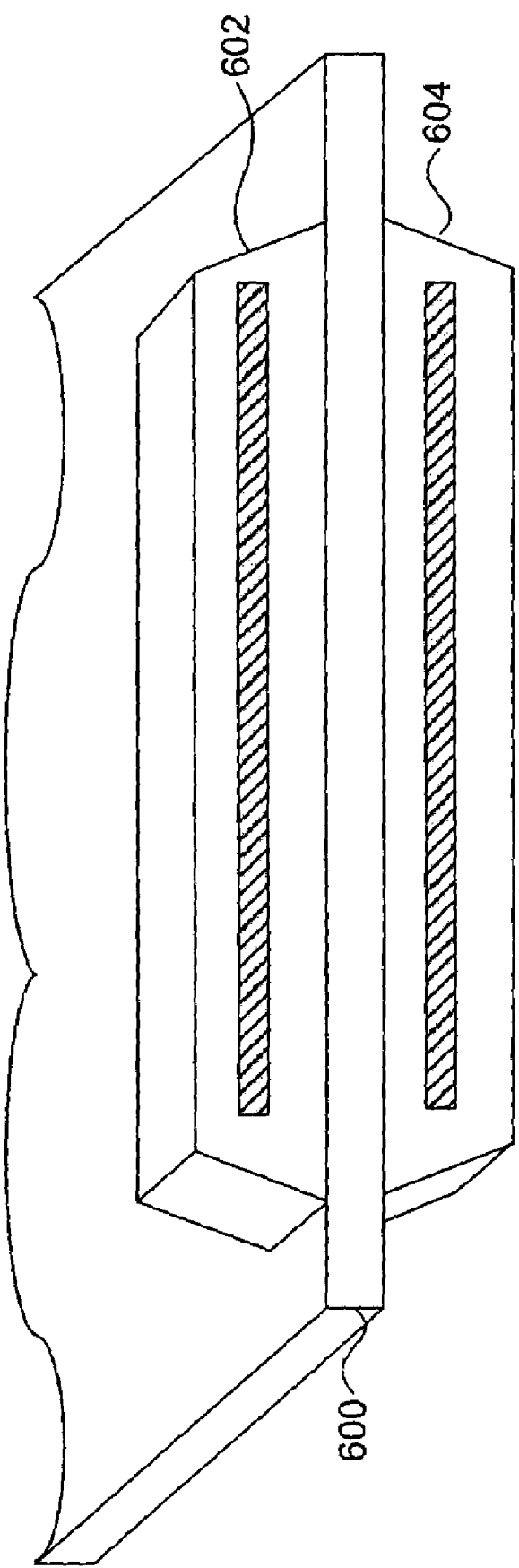
FIG. 6 is a perspective view of a further embodiment showing the use of one or more single connectors each adapted to provide connections to a plurality of devices, and mounted near the rear edge of the board.

FIG. 6 illustrates another embodiment of the invention which uses one or more combination device connectors, shown at 602 and 604, each adapted to provide connections to a plurality of devices, and mounted near the rear edge of the board 600. FIG. 6 is an edgewise view of the board 600 with two combination device connectors 602 and 604. In an exemplary embodiment, each connector has 25 conductors, comprising eight conductors for each of four drives and a common ground line for all four disk drives. Connector 602 is preferably mounted at or near the rear edge of the board 600 where there is more space available for making connections. This rearward region of the board 600 is also closer to the array disks and facilitates easier connections of cables. In the embodiment shown, connector 604 is mounted on the opposite side of board 600 from connector 602. This is a compact design that reduces the number of connectors that have to be mounted on the board, thereby eliminating the disarray of connectors in conventional designs and simultaneously providing better usage of board real estate. Each of the 25 pin connectors of the exemplary embodiment is designed to interface with up to four drives. However, the number of drives that can be connected and the number of conductors in each cable can be modified without departing from the spirit of the invention.

Figure 7:
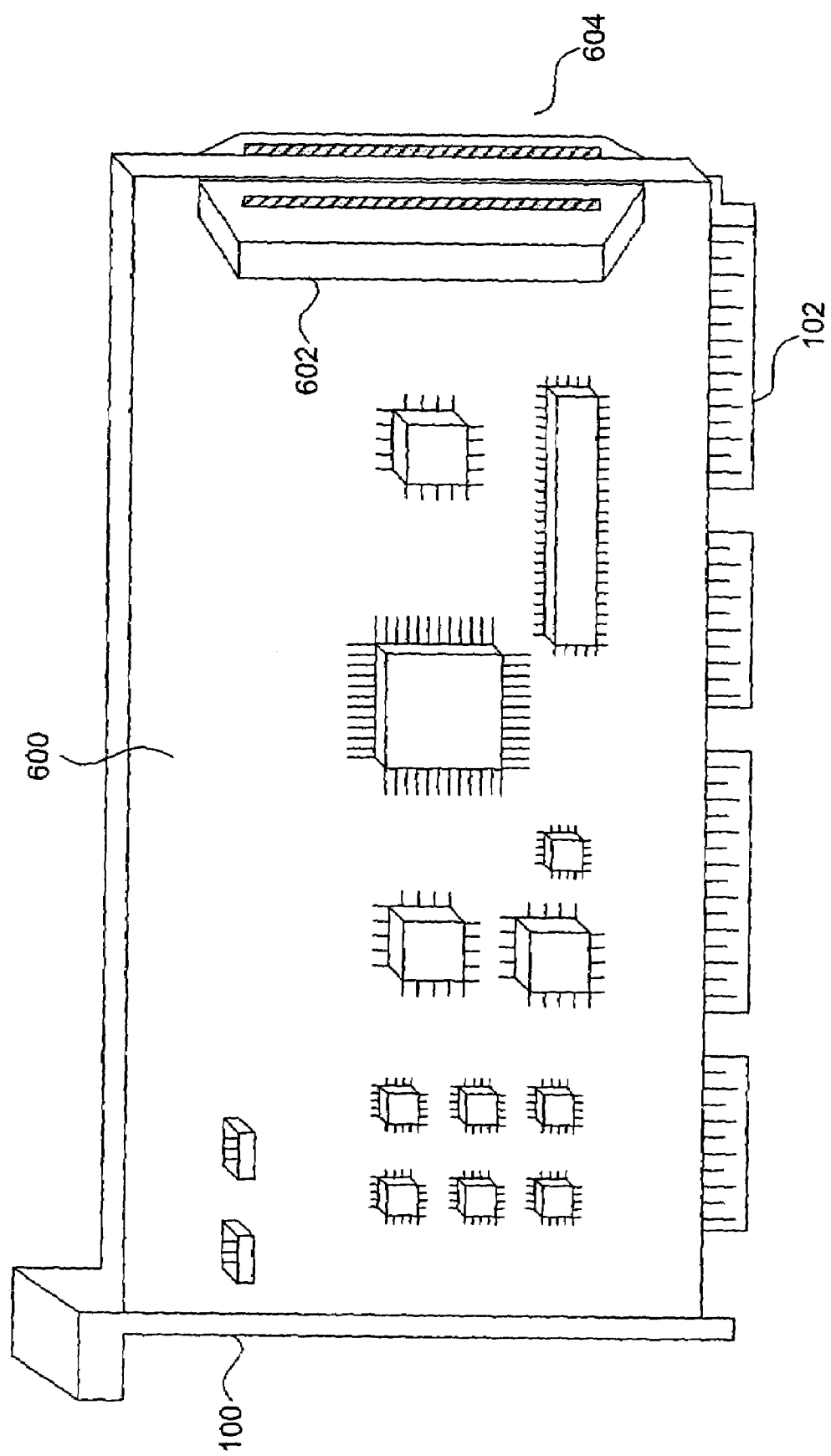
FIG. 7 is a perspective view showing the entire board of the embodiment in FIG. 6.

FIG. 7 illustrates another view of the embodiment shown in FIG. 6. Board 600 comprises a bracket 100, a PCI edge connector 102 and device connectors 602 and 604. Bracket 100 is used to mount the board 600 to the housing of a computer system. PCI edge connector 102 is used to interface the board 600 with a corresponding slot in a computer system. Connector 602, which may be for example a 25-pin connector, is preferably mounted at the rear edge of board 600, distant from the end on which bracket 100 is mounted, where there is more space available for making connections. Connector 604 is mounted on the opposite side of board 600 from connector 602. Connectors 602 and 604 are oriented such that mating with a corresponding disk drive connector occurs through relative movement of the mated disk drive connectors parallel to a length of board 600. The placement and orientation of connectors 602 and 604 on the RAID controller board 600 facilitates mating between corresponding connectors. The rearward region of board 600 is also closer to the array disks and facilitates easier connections of cables. Although in an exemplary embodiment connectors 602 and 604 are mounted near the rearward edge of the board 600, the exact location and configuration of connectors can vary based on changes in the shape and orientation of board 600. Connectors 602 and 604 may be mounted on the board 600 via SMT, THT or other available technologies.

Figure 8:
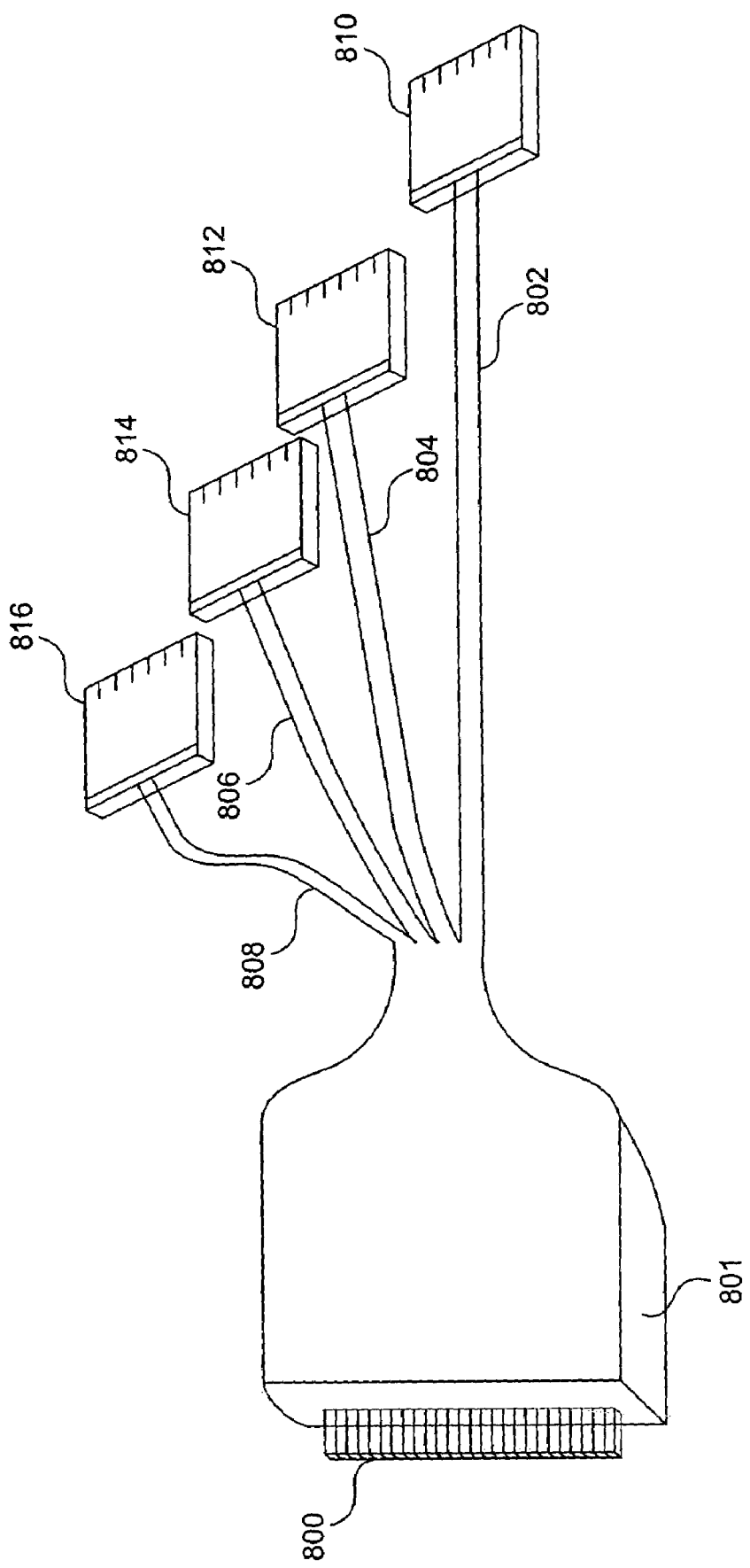
FIG. 8 is a diagram of a cable connector adapted to interface with the connectors shown in the embodiments in FIGS. 6-7.

FIG. 8 illustrates a cable assembly 801 that can interface with either of the combined device connectors 602 or 604 (shown in FIGS. 6 and 7). The cable assembly comprises a cable assembly connector 800, cable segments 802, 804, 806 and 808, and disk drive component connectors 810, 812, 814 and 816. In the embodiment shown, cable assembly connector 800 comprises conductors at a proximate end of the cable that mate with corresponding connectors 602 and 604. In the example shown, there are 25 conductors in cable assembly connector 800. A distal end of cable assembly 801 branches to provide four flexible cables 802, 804, 806 and 808. In one embodiment as shown in FIG. 8, these cables 802, 804, 806 and 808 have varying lengths. The difference in cable lengths allows for easier connections to disk drives that are in a row or column arrangement and are relatively evenly spaced. This embodiment facilitates the mating of connectors and simplifies the routing of the cables connecting such drives to a RAID controller board. The four cables 802, 804, 806 and 808 terminate at four disk drive connectors 810, 812, 814 and 816 respectively. Each of the disk drive connectors 810, 812, 814 and 816 have eight conductor pins to interface with corresponding connectors on disk drives. The 25 lines provided by conductors 800 include a common ground line that can be utilized by each of the disk drive connectors 810, 812, 814 and 816. In another embodiment, the cables 802, 804, 806 and 808 can be of the same length if desired. The length of cables 802, 804, 806 and 808 and the number of such cables can be varied within the scope of the invention.

Figure 9:
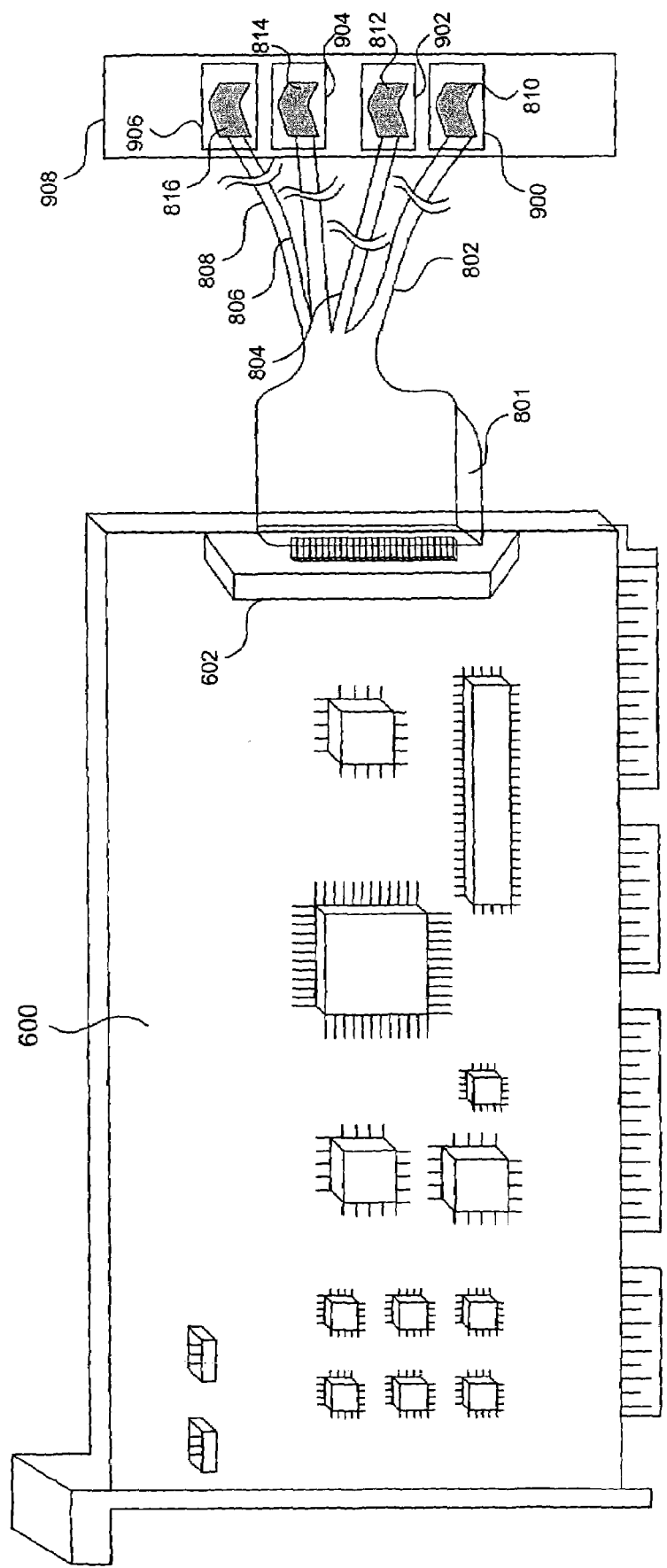
FIG. 9 is an assembly drawing illustrating mating of the cable connectors and the disk drive connectors using the cable connector of FIG. 8.

FIG. 9 shows board 600, connector 602, cable connector 801, cables 802, 804, 806 and 808, disk drive component connectors 810, 812, 814 and 816, disk drives 900, 902, 904 and 906 and disk enclosure 908. The figure illustrates connection between the cable adapter 801 and connector 602 mounted on the board 600. It also shows the connection of disk drive connectors 810, 812, 814 and 816 to disk drives 900, 902, 904 and 906 respectively. The disks are arranged in a row in the disk enclosure 908. Since the disks have an even spacing, providing cables 802, 804, 806 and 808 with staggered lengths simplifies mating the connectors with the respective drives. The use of a single connector 602 for multiple disk drives 900, 902, 904 and 906 reduces the number of connectors used on board 600 and simplifies routing and connection of the cables between board 600 and the drives.

Although the embodiments presented above are for RAID controller boards, the inventive concepts disclosed herein may be applied to embodiments involving any board with connectors that interface to other devices. In the context of RAID controllers, the terms disk drive, drive and disk are used interchangeably throughout and refer to any storage medium, such as a hard disk, optical disk, solid state memory device, or any other type of storage element. In applications other than RAID controllers, the connections made using the invention may be to any device, instead of a disk or drive. The invention has merely been described in terms of connections to disks or drives to provide an example for purposes of disclosure.

The embodiments presented above are illustrated using rectangular PCB boards. However the shape of the board and the configuration of connectors can be changed without departing from the spirit of the invention. The embodiments presented above have connectors for up to eight disk drives, however the number of drives may be increased or decreased within the spirit of the invention. The connectors on the RAID controller in the embodiments presented above can interface with drives conforming to either the serial advanced technology attachment (SATA) or the serial attached small computer system interface (SAS) industry standards. The invention may also be adapted to connect to devices corresponding to other industry standards or conforming to proprietary standards.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. An interface board comprising:
   a first edge portion configured to mate with a housing of a computing device;

a second edge portion adjacent to said first edge portion and having an edge connector to interface said board with a corresponding slot in said computing device;

a device connector mounted proximate to a third edge portion spaced from said first and second edge portions, and adapted to provide an electrical connection with a component device; and a control circuit located on said interface board and connected to said edge connector and said device connector to exchange signals with said component device through said device connector to control operation of said component device;

wherein said third edge portion has at least one spacer to increase a thickness of said third edge portion.

2. The board of claim 1, wherein said interface board is a printed circuit board (PCB).

3. The board of claim 1, wherein said device connector interfaces with another connector of a compatible hardware element.

4. The board of claim 1, wherein said device connector interfaces with another connector conforming to serial advanced technology attachment (SATA) industry standard or serial attached small computer system interface (SAS) industry standard.

5. The board of claim 1, wherein said board conforms to a peripheral component interface (PCI) standard.

6. The board of claim 1, wherein said board conforms to a peripheral component interface (PCI) 2U standard.

7. The board of claim 1, wherein said board is rectangular in shape.

8. The board of claim 1, wherein said first edge portion is parallel to said third edge portion.

9. The board of claim 1, wherein at least two device connectors are mounted proximate said third edge portion on opposite sides of said board.

10. The board of claim 1, wherein a plurality of device connectors are mounted proximate said third edge portion with at least one connector mounted on each of two sides of said board.

11. The board of claim 1, wherein said board has at least one device connector to interface with at least four compatible component devices.

12. The board of claim 1, wherein said device connector is oriented such that mating of a component device with a corresponding device connector occurs through relative movement of said corresponding device connector parallel to a length of said board.

13. The board of claim 1, wherein said component device comprises a data storage device.

14. The board of claim 8, wherein said second edge portion is parallel to a fourth edge portion.

15. The board of claim 14, wherein said first and third edge portions are located along a width of said board.

16. The board of claim 15, wherein said fourth edge portion and said second edge portion are located along a length of said board.

17. The board of claim 10, wherein said board has device connectors to interface with at least eight compatible devices.

18. The board of claim 16, wherein at least one device connector is attached proximate to a third edge portion of said board.

19. An interface board comprising:

a first edge portion configured to mate with a housing of a computing device;

a second edge portion adjacent to said first edge portion and having an edge connector to interface said board with a corresponding slot in said computing device;

a first device connector mounted proximate to a third edge portion opposing said first edge portion, and adapted to provide an electrical connection with a first component device;

a second device connector mounted on said first device connector and adapted to provide an electrical connection with a second component device; and a control circuit located on said interface board and connected to said edge connector and said device connectors to exchange signals with said component devices through said device connectors to control operation of said component devices.

20. The board of claim 19, wherein a plurality of said first device connectors are mounted on either side of said third edge portion with said second device connectors mounted on said first device connectors.

21. The board of claim 19, wherein said first and second device connectors are oriented such that mating of a component device with a corresponding device connector occurs through relative movement of said corresponding device connector parallel to a length of said board.

22. An interface board comprising:

a first edge portion configured to mate with a housing of a computing device;

a second edge portion adjacent to said first edge portion and having an edge connector to interface said board with a corresponding slot in said computing device;

a device connector mounted proximate to a third edge portion opposing said first edge portion, and adapted to connect to a cable assembly providing electrical connections to a plurality of component devices; and a control circuit located on said interface board and connected to said edge connector and said device connector to exchange signals with said component device through said device connector to control operation of said component device.

23. The board of claim 22, wherein said device connector incorporates conductors for controlling said component devices.

24. The board of claim 22, wherein the cable assembly provides connections for at least four devices.

25. The board of claim 22, wherein said cable assembly has a connector at a proximate end, coupled by a plurality of cable segments to component connectors at distal ends thereof, and each of said cable segments varies in length.

26. The board of claim 22, wherein said board has at least two of said device connectors incorporating conductors for controlling a plurality of devices.

27. The board of claim 26, wherein said device connectors are oriented such that mating with a corresponding cable assembly connector occurs through relative movement of said corresponding device connector parallel to a length of said board.

* * * * *